United States Patent
Zhao et al.

(10) Patent No.: US 8,847,689 B2
(45) Date of Patent: Sep. 30, 2014

(54) STACKED AMPLIFIER WITH DIODE-BASED BIASING

(75) Inventors: Yu Zhao, San Diego, CA (US); Nathan M. Pletcher, Encinitas, CA (US)

(73) Assignee: QUALCOMM Incorporated, San Diego, CA (US)

(*) Notice: Subject to any disclaimer, the term of this patent is extended or adjusted under 35 U.S.C. 154(b) by 79 days.

(21) Appl. No.: 12/711,858

(22) Filed: Feb. 24, 2010

(65) Prior Publication Data

US 2011/0043284 A1 Feb. 24, 2011

Related U.S. Application Data

(60) Provisional application No. 61/235,317, filed on Aug. 19, 2009.

(51) Int. Cl.
*H03F 3/04* (2006.01)

(52) U.S. Cl.
USPC ............................ 330/311; 330/277; 330/285

(58) Field of Classification Search
CPC ...................................................... H03F 1/223
USPC ................................................. 330/277, 311
See application file for complete search history.

(56) References Cited

U.S. PATENT DOCUMENTS

| | | | |
|---|---|---|---|
| 3,603,892 A | 9/1971 | Paine et al. |
| 3,622,899 A | 11/1971 | Eisenberg |
| 3,832,643 A | 8/1974 | Van Heyningen et al. |
| 3,986,132 A | 10/1976 | Wittlinger |
| 4,672,664 A | 6/1987 | Boeckmann |
| 4,897,617 A | 1/1990 | Milberger et al. |
| 4,900,955 A | 2/1990 | Kurpan |

(Continued)

FOREIGN PATENT DOCUMENTS

| | | |
|---|---|---|
| CN | 1838529 A | 9/2006 |
| DE | 2705604 | 8/1977 |

(Continued)

OTHER PUBLICATIONS

Youn Sub Noh; Chul Soon Park; "PCS/W-CDMA dual-band MMIC power amplifier with a newly proposed linearizing bias circuit," Solid-State Circuits, IEEE Journal of; vol. 37 , Issue: 9 Digital Object Identifier: 10.1109/ JSSC.2002.801169; Sep. 2002, pp. 1096-1099.

(Continued)

*Primary Examiner* — Robert Pascal
*Assistant Examiner* — Khiem Nguyen
(74) *Attorney, Agent, or Firm* — Ramin Mobarhan

(57) ABSTRACT

Techniques for improving linearity of amplifiers are described. In an exemplary design, an amplifier (e.g., a power amplifier) may include a plurality of transistors coupled in a stack and at least one diode. The plurality of transistors may receive and amplify an input signal and provide an output signal. The at least one diode may be operatively coupled to at least one transistor in the stack. Each diode may provide a variable bias voltage to an associated transistor in the stack. Each diode may have a lower voltage drop across the diode at high input power and may provide a higher bias voltage to the associated transistor at high input power. The at least one transistor may have higher gain at high input power due to the higher bias voltage from the at least one diode. The higher gain may improve the linearity of the amplifier.

25 Claims, 8 Drawing Sheets

(56) References Cited

U.S. PATENT DOCUMENTS

| | | |
|---|---|---|
| 6,215,358 B1 * | 4/2001 | Hon et al. .................. 330/289 |
| 6,392,492 B1 | 5/2002 | Yuan |
| 7,023,281 B1 | 4/2006 | Ali |
| 7,253,690 B1 | 8/2007 | Jin et al. |
| 7,541,875 B2 * | 6/2009 | Taylor et al. ............... 330/311 |
| 7,551,036 B2 * | 6/2009 | Berroth et al. .............. 330/311 |
| 7,911,279 B2 * | 3/2011 | Chow et al. ................. 330/311 |
| 7,911,280 B2 * | 3/2011 | Koerner ..................... 330/311 |
| 2004/0085130 A1 | 5/2004 | Luo |
| 2006/0028263 A1 | 2/2006 | Gruber et al. |
| 2006/0226910 A1 | 10/2006 | Tanoi |
| 2009/0085664 A1 | 4/2009 | Yang et al. |

FOREIGN PATENT DOCUMENTS

| | | |
|---|---|---|
| EP | 0215707 | 3/1987 |
| EP | 0616420 | 9/1994 |
| EP | 1081573 A1 | 3/2001 |
| EP | 1085653 | 3/2001 |
| EP | 1624572 | 2/2006 |
| GB | 2071451 | 9/1981 |
| JP | 48076456 A | 10/1973 |
| JP | 1254014 A | 10/1989 |
| JP | 9260964 A | 10/1997 |
| JP | 11068471 A | 3/1999 |
| JP | 2001094360 A | 4/2001 |
| JP | 2002100937 A | 4/2002 |
| JP | 2003500882 A | 1/2003 |
| WO | 0070763 A1 | 11/2000 |
| WO | WO03049280 | 6/2003 |

OTHER PUBLICATIONS

Jinho Jeong et al.; "A 20 dBm Linear RF Power Amplifier Using Stacked Silicon-on-Sapphire MOSFETs," Microwave and Wireless Components Letters, IEEE; vol. 16 , Issue: 12, Digital Object Identifier: 10.1109/ LMWC.2006.885634, Dec. 2006 , pp. 684-686.

Youngoo Yang et al.; "DC boosting effect of active bias circuits and its optimization for class-AB InGaP—GaAs HBT power amplifiers" Microwave Theory and Techniques, IEEE Transactions on; vol. 52 , Issue: 5 Digital Object Identifier: 10.1109/TMTT.2004.827021; May 2004 , pp. 1455-1463.

Yoshimasu, T. et al.; "An HBT MMIC power amplifier with an integrated diode linearizer for low-voltage portable phone applications," Solid-State Circuits, IEEE Journal of ; vol. 33 , Issue: 9; Digital Object Identifier: 10.1109/4.711326 Sep. 1998, pp. 1290-1296.

International Search Report and Written Opinion—PCT/US2010/046023, International Search Authority—European Patent Office—Dec. 8, 2010.

Cui X et al., "A 3.5 GHz CMOS Doherty power amplifier with integrated diode linearizer targeted for WiMax applications", Circuits and Systems, 2007. MWSCAS 2007.50th Midwest Symposium on, IEEE, Piscataway, NJ, USA, Aug. 5, 2007, pp. 465-468, XP031243211, ISBN: 978-1-4244-1175-7.

Yen C et al., "A 0.25- m 20-dBm 2.4-GHz CMOS power amplifier with an integrated diode linearizer", IEEE Microwave and Wireless Components Letters, IEEE Service Center, NewYork, NY, US, vol. 13, No. 2, Feb. 1, 2003, pp. 45-47, XP011427760, ISSN: 1531-1309, DOI: 10.1109/LMWC.2003.808722.

\* cited by examiner

12
STACKED AMPLIFIER WITH DIODE-BASED BIASING

CLAIM OF PRIORITY UNDER 35 U.S.C. §119

The present Application for Patent claims priority to Provisional U.S. Application Ser. No. 61/235,317, entitled "DIODE BASED BIAS CIRCUIT FOR STACKED PA," filed Aug. 19, 2009, assigned to the assignee hereof, and expressly incorporated herein by reference.

BACKGROUND

I. Field

The present disclosure relates generally to electronics, and more specifically to amplifiers.

II. Background

Amplifiers are commonly used in various electronic devices to provide signal amplification. Different types of amplifiers are available for different uses. For example, a wireless communication device such as a cellular phone may include a transmitter and a receiver for bi-directional communication. The transmitter may include a driver amplifier (DA) and a power amplifier (PA), the receiver may include a low noise amplifier (LNA), and the transmitter and receiver may include variable gain amplifiers (VGAs).

Linearity is an important design goal for a power amplifier. The power amplifier may be designed to meet linearity requirements by using sufficiently large transistors and applying appropriate biasing. The power amplifier may have extra margin in linearity, which may then be used to boost efficiency of the power amplifier and reduce current consumption. Extra linearity margin may also be used to reduce transistor size and may lead to saving of chip area as well as cost. A power amplifier with good linearity may thus be highly desirable.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for improving the linearity of amplifiers are described herein. The techniques may be used for various types of amplifiers such as power amplifiers, driver amplifiers, LNAs, VGAs, etc. The techniques may also be used for amplifiers in various electronic devices such as wireless communication devices, cellular phones, personal digital assistants (PDAs), handheld devices, wireless modems, laptop computers, cordless phones, Bluetooth devices, consumer electronic devices, etc. For clarity, the use of the techniques for amplifiers in a wireless communication device is described below.

Figure 1:
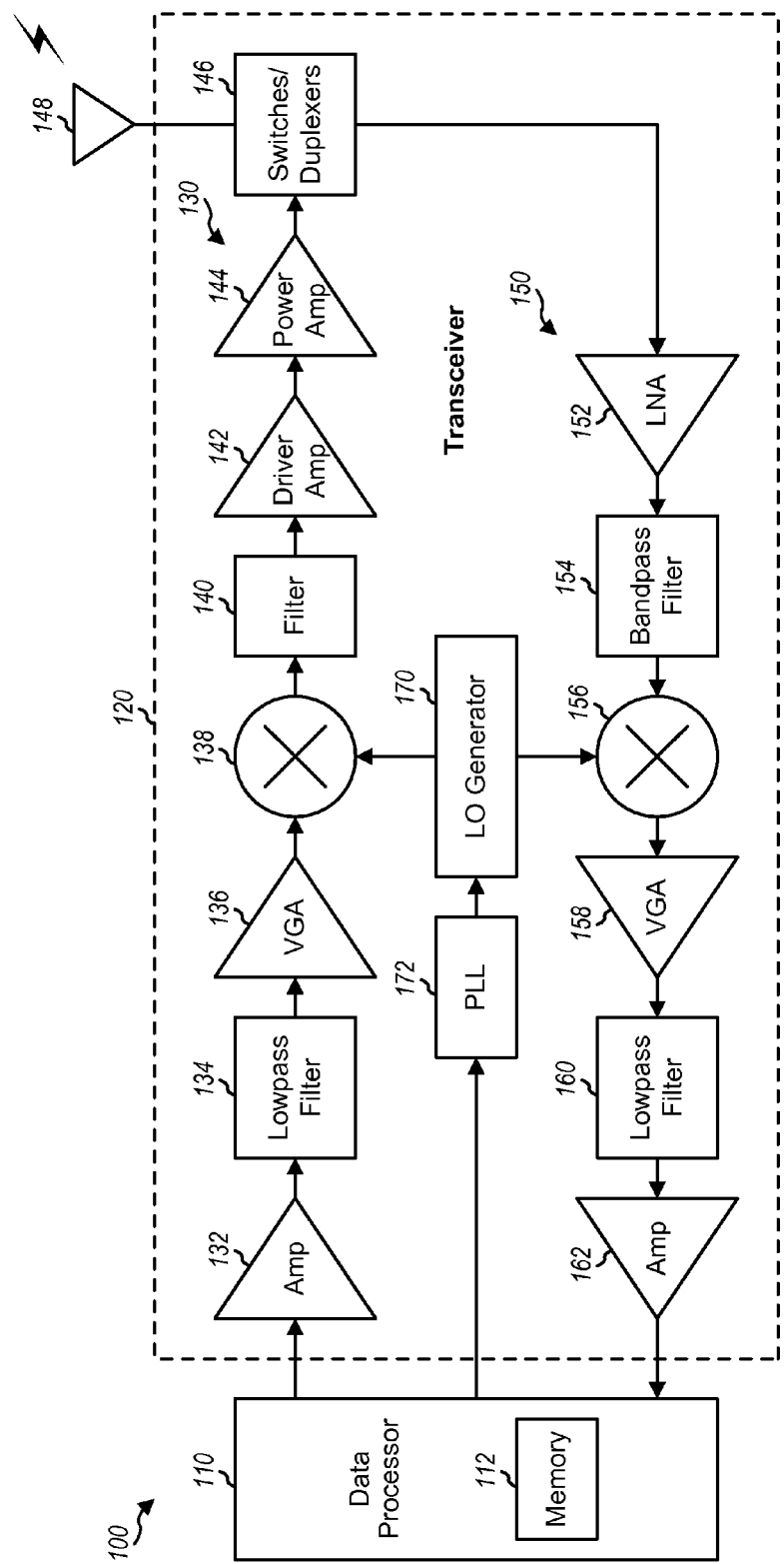
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to radio frequency (RF) by a mixer 138. The upconverted signal is filtered by a filter 140, further amplified by a driver amplifier 142 and a power amplifier 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a superheterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and receiver. For example, matching circuits may be used to match various active circuits in FIG. 1. Some circuits in FIG. 1 may also be omitted. All or a portion of transceiver 120 may be implemented on one or more analog integrated circuits (ICs), RF ICs (RFICs), mixed-signal ICs, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

The techniques for improving the linearity of amplifiers described herein may be used for various types of amplifiers, such as the amplifiers shown in FIG. 1. For clarity, much of the description below covers improving the linearity of a power amplifier, e.g., power amplifier 144 in FIG. 1. The techniques can vary the biasing of the power amplifier to improve linearity when needed at high input RF power.

Figure 2:
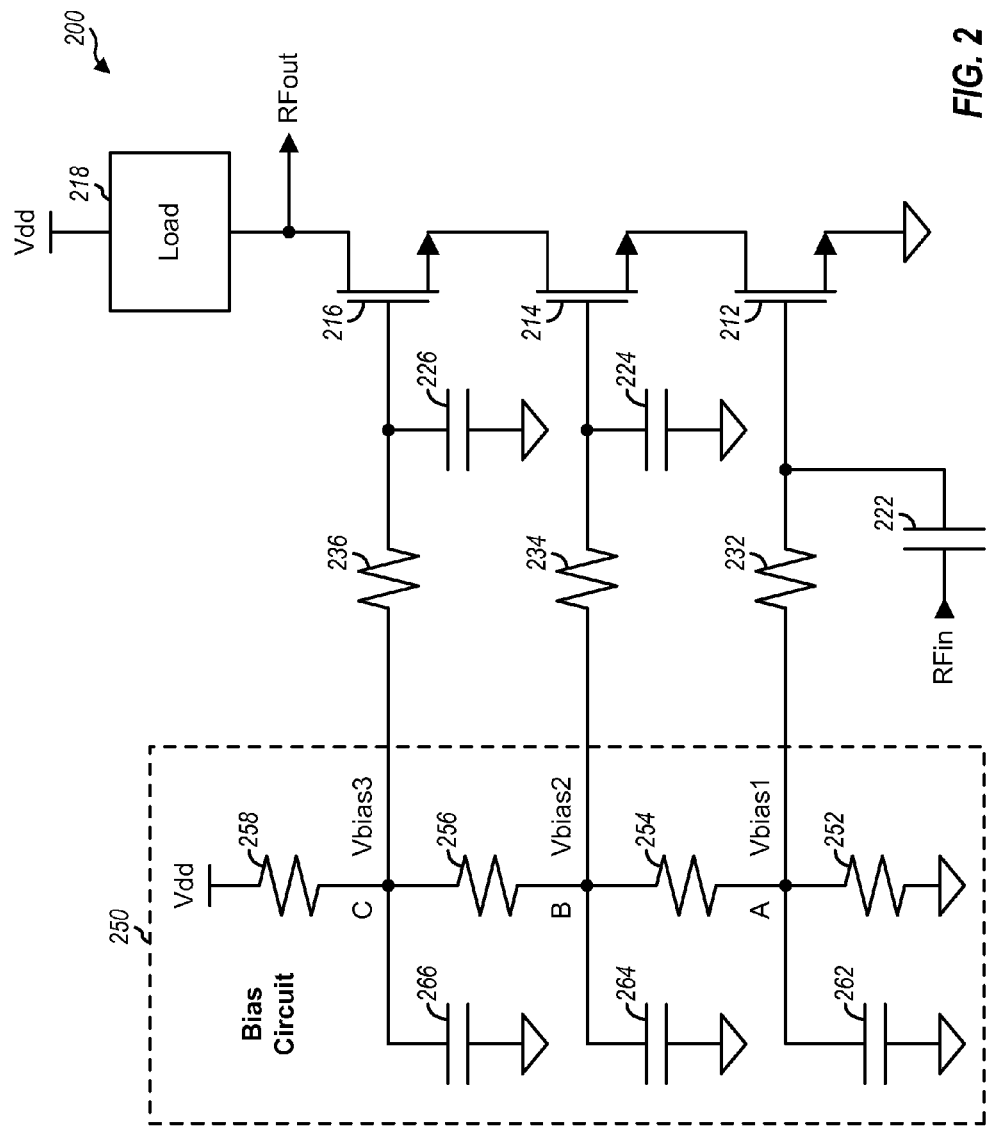
FIG. 2 shows a power amplifier with stacked transistors.

FIG. 2 shows a schematic diagram of an exemplary design of a power amplifier 200 implemented with stacked transistors. In the exemplary design shown in FIG. 2, power amplifier 200 is implemented with three N-channel metal oxide semiconductor (NMOS) transistors 212, 214 and 216 coupled in a stack. NMOS transistor 212 has its gate coupled to one end of a resistor 232 and its source coupled to circuit ground. NMOS transistor 214 has its gate coupled to one end of a resistor 234 and its source coupled to the drain of NMOS transistor 212. NMOS transistor 216 has its gate coupled to one end of a resistor 236, its source coupled to the drain of NMOS transistor 214, and its drain providing an output RF signal (RFout). The other end of resistors 232, 234 and 236 are coupled to nodes A, B and C, respectively. A capacitor 224 is coupled between the gate of NMOS transistor 214 and circuit ground. A capacitor 226 is coupled between the gate of NMOS transistor 216 and circuit ground. A load 218 is coupled between a power supply (Vdd) and the drain of NMOS transistor 216. Load 218 may include an inductor, a capacitor, an MOS transistor, and/or other circuits. An AC-coupling capacitor 222 has one end receiving an input RF signal (RFin) and the other end coupled to the gate of NMOS transistor 212.

A bias circuit 250 generates bias voltages for NMOS transistors 212, 214 and 216. In the exemplary design shown in FIG. 2, bias circuit 250 includes a resistor ladder formed by four resistors 252, 254, 256 and 258 coupled in series and between Vdd and circuit ground. The top end of resistor 252 is coupled to node A and provides a first bias voltage (Vbias1). The top end of resistor 254 is coupled to node B and provides a second bias voltage (Vbias2). The top end of resistor 256 is coupled to node C and provides a third bias voltage (Vbias3). Capacitors 262, 264 and 266 have one end coupled to nodes A, B and C, respectively, and the other end coupled to circuit ground.

NMOS transistor 212 is a gain transistor that provides signal amplification for the RFin signal. NMOS transistors 214 and 216 provide signal amplification as well as signal drive for the RFout signal. Improved reliability may be achieved by using multiple NMOS transistors coupled in a stack. The RFout signal may have a large voltage swing, which may exceed a breakdown voltage of each NMOS transistor. The voltage swing of the RFout signal may be split or distributed approximately equally across NMOS transistors 212, 214 and 216. Each NMOS transistor may then observe only a fraction of the voltage swing, which should be less than the breakdown voltage of the NMOS transistor in order to achieve good reliability. The use of stacked transistors is especially desirable for high frequency amplifiers implemented with transistors fabricated with deep sub-micron IC processes and having low breakdown voltages. The stacked transistors can essentially multiply the breakdown voltage to improve reliability.

Resistors 232, 234 and 236 provide isolation for NMOS transistors 212, 214 and 216, respectively. Resistors 232, 234 and 236 prevent too much RF signal from leaking from NMOS transistors 212, 214 and 216 to bias circuit 250, which may then cause a drop in the gain of power amplifier 200. Resistors 232, 234 and 236 may have fixed values (as shown in FIG. 2) or may have adjustable values (not shown in FIG. 2). In either case, the values of resistors 232, 234 and 236 may be selected to provide the desired amount of isolation between NMOS transistors 212, 214 and 216 and bias circuit 250. Capacitors 224 and 226 provide the proper RF signal strength at the gates of NMOS transistors 214 and 216, respectively.

Bias circuit 250 generates appropriate bias voltages for NMOS transistors 212, 214 and 216. Resistors 252, 254, 256 and 258 may be selected to obtain the desired Vbias1, Vbias2 and Vbias3 voltages for NMOS transistors 212, 214 and 216, respectively, e.g., to obtain the desired gain for the NMOS transistors and to achieve the desired voltage splitting across the NMOS transistors. Capacitors 262, 264 and 266 provide low RF impedance looking into bias circuit 250 from the gates of NMOS transistors 212, 214 and 216, respectively. The sizes of capacitors 262, 264 and 266 may be selected to provide the desired impedance for the leaked RF signals from NMOS transistors 212, 214 and 216.

FIG. 2 shows an exemplary design of bias circuit 250 implementing a resistor ladder to generate bias voltages for the NMOS transistors in power amplifier 200. A bias circuit may also be implemented with other exemplary designs that can generate the desired bias voltages for a power amplifier.

FIG. 2 shows an exemplary design of power amplifier 200 with three NMOS transistors coupled in a stack. In general, a power amplifier may be implemented with any number of NMOS transistors coupled in a stack. The number of NMOS transistors to couple in a stack may be determined based on the expected maximum voltage swing of the RFout signal, the breakdown voltage of each NMOS transistor, and/or other factors.

Power amplifier 200 may be able to handle a large RFout signal using NMOS transistors having a small breakdown voltage. However, power amplifier 200 may have relatively poor linearity performance under certain operating scenarios. The gain of NMOS transistor 212 typically decreases at high input RF power. The lower gain of NMOS transistor 212 may result in worse linearity for power amplifier 200 at high input RF power, which may be undesirable.

Figure 3:
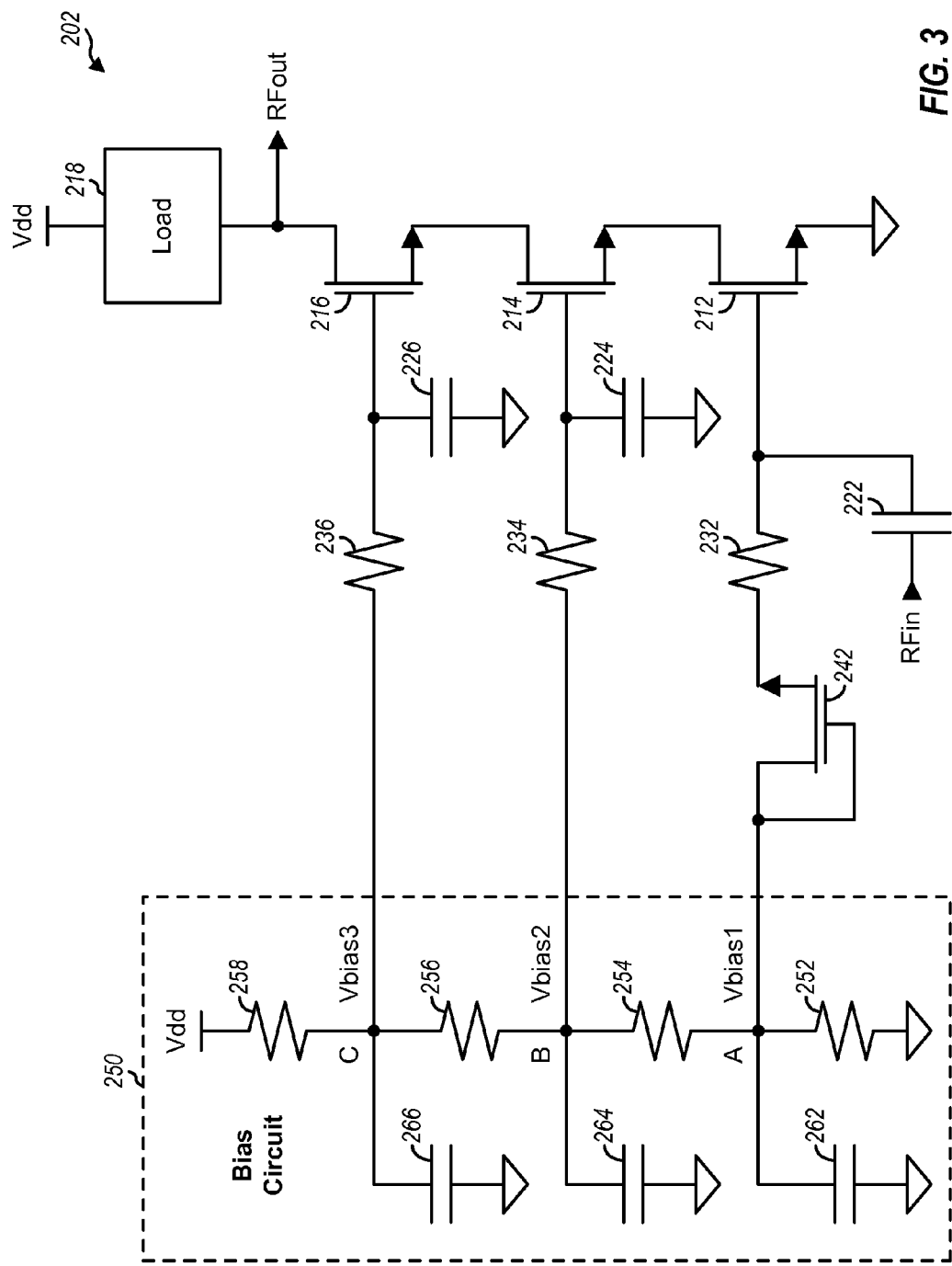
FIGS. 3 and 4 show two power amplifiers with stacked transistors and diode-based biasing.

FIG. 3 shows a schematic diagram of an exemplary design of a power amplifier 202 implemented with stacked transistors and having diode-based biasing for the gain transistor. Power amplifier 202 includes NMOS transistors 212, 214 and 216, load 218, capacitors 222, 224 and 226, resistors 232, 234 and 236, and bias circuit 250, which are coupled as described above for power amplifier 200 in FIG. 2. Power amplifier 202 further includes an NMOS transistor 242 coupled in a diode configuration. NMOS transistor 242 has its gate coupled to its drain and its drain coupled to node A. Resistor 232 has one end coupled to the gate of NMOS transistor 212 and the other end coupled to the source of NMOS transistor 242. NMOS transistor 242 may be implemented with a symmetric structure, and the source and drain of NMOS 242 transistor may be interchangeable.

Diode-connected NMOS transistor 242 has a gate-to-source voltage of Vgs_diode1. The voltage drop across resistor 232 may be negligible. A gate voltage (Vg1) of NMOS transistor 212 may then be expressed as:

$$Vg1 = Vbias1 - Vgs\_diode1. \quad \text{Eq (1)}$$

The Vgs_diode1 voltage of diode-connected NMOS transistor 242 is dependent on input RF power. The amount of RF current that leaks from NMOS transistor 212 to bias circuit 250 is dependent on (e.g., is proportional to) the input RF power. When the input RF power is high, diode-connected NMOS transistor 242 rectifies the RF current that leaks from NMOS transistor 212 to bias circuit 250. The rectified RF current results in a smaller Vgs_diode1 voltage as the input RF power is increased. The Vbias1 voltage may be a fixed voltage. In this case, a decrease in the Vgs_diode1 voltage would result in an increase in the Vg1 voltage. Since the Vg1 voltage is equal to a gate-to-source (Vgs) voltage of NMOS transistor 212, the higher Vg1 voltage increases the Vgs voltage and hence the gain of NMOS transistor 212 at high input RF power. The higher gain may improve the linearity of power amplifier 202.

Figure 4:
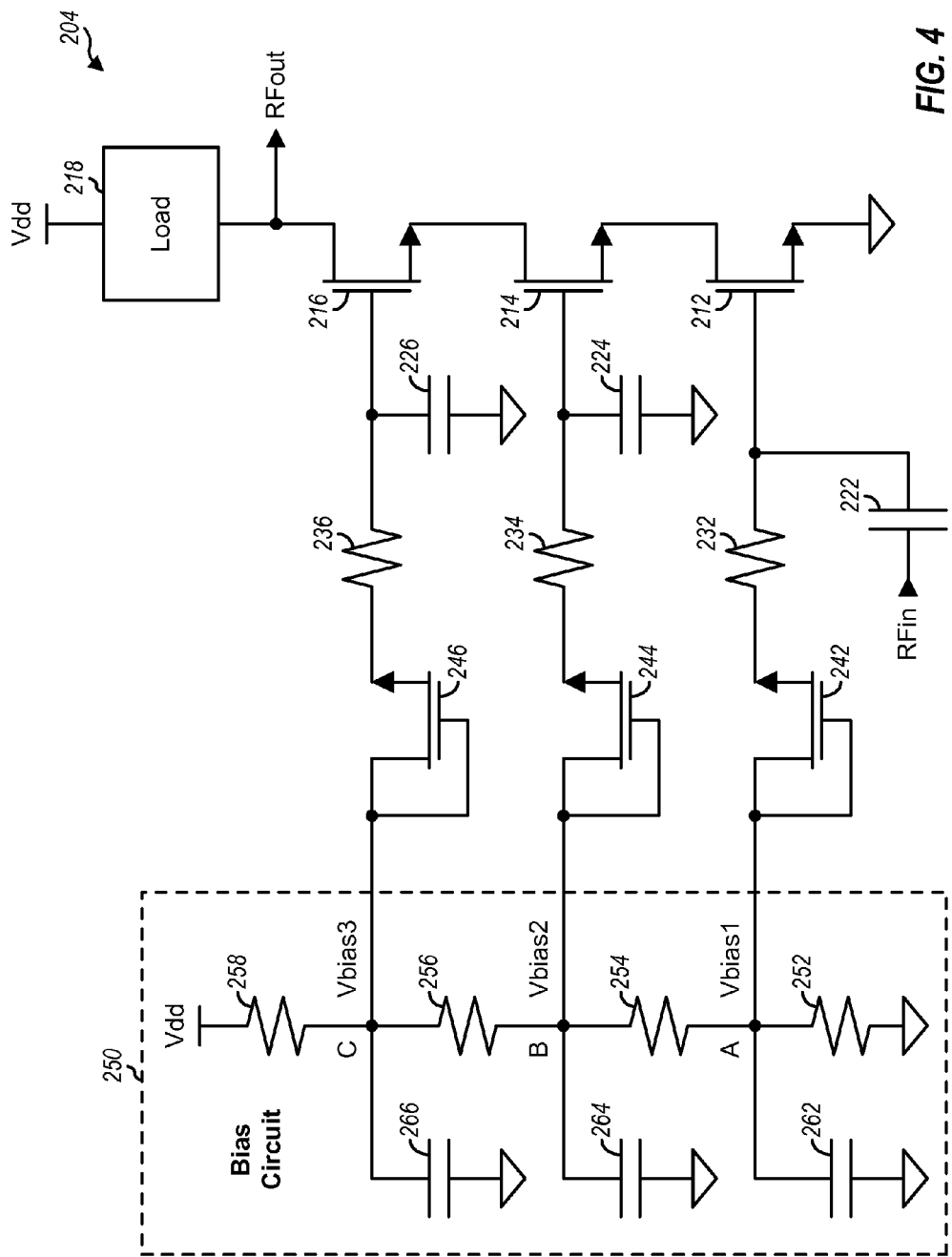

FIG. 4 shows a schematic diagram of an exemplary design of a power amplifier 204 implemented with stacked transistors and having diode-based biasing for each transistor in the stack. Power amplifier 204 includes all of the circuit components in power amplifier 202 in FIG. 3. Power amplifier 204 further includes NMOS transistors 244 and 246, each of which is coupled in a diode configuration. NMOS transistor 244 has its gate coupled to its drain and its drain coupled to node B. Resistor 234 has one end coupled to the gate of NMOS transistor 214 and the other end coupled to the source of NMOS transistor 244. Similarly, NMOS transistor 246 has its gate coupled to its drain and its drain coupled to node C. Resistor 236 has one end coupled to the gate of NMOS transistor 216 and the other end coupled to the source of NMOS transistor 246.

Bias circuit 250 may provide fixed Vbias1, Vbias2 and Vbias3 voltages. Diode-connected NMOS transistors 242, 244 and 246 may have Vgs voltages of Vgs_diode1, Vgs_diode2 and Vgs_diode3, respectively, which may be variable and dependent on the input RF power. NMOS transistors 212, 214 and 216 have gate voltages of Vg1, Vg2 and Vg3, respectively, which may be variable and dependent on (i) the Vbias1, Vbias2 and Vbias3 voltages from bias circuit 250 and (ii) the Vgs_diode1, Vgs_diode2 and Vgs_diode3 voltages of diode-connected NMOS transistors 242, 244 and 246. The Vg voltage of each NMOS transistor may be determined based on the Vbias voltage and the Vgs_diode voltage applicable for that NMOS transistor, as shown in equation (1). The Vg voltage of each NMOS transistor may increase at high input RF power, which may improve the gain of that NMOS transistor. The higher gains for NMOS transistors 212, 214 and 216 may improve the linearity of power amplifier 204.

Figure 7:
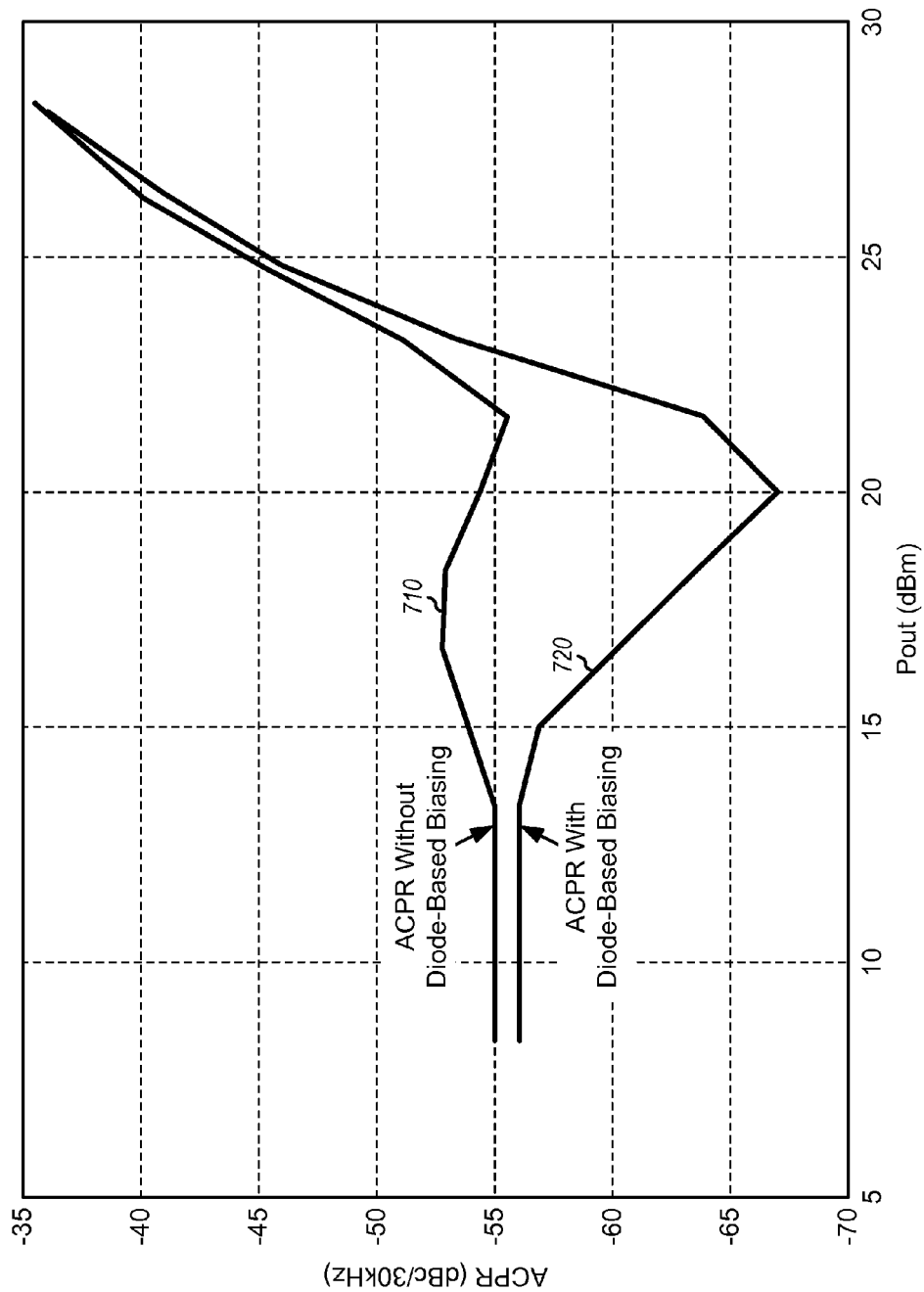
FIG. 7 shows plots of the performance of a power amplifier with and without diode-based biasing.

The improvement in linearity of power amplifiers 202 and 204 with the use of diode-based biasing may be quantified by various metrics such as adjacent channel power ratio (ACPR). Computer simulation indicates that ACPR improves for a Code Division Multiple Access (CDMA) signal when diode-based biasing is employed, as shown in FIG. 7.

Figure 5A:
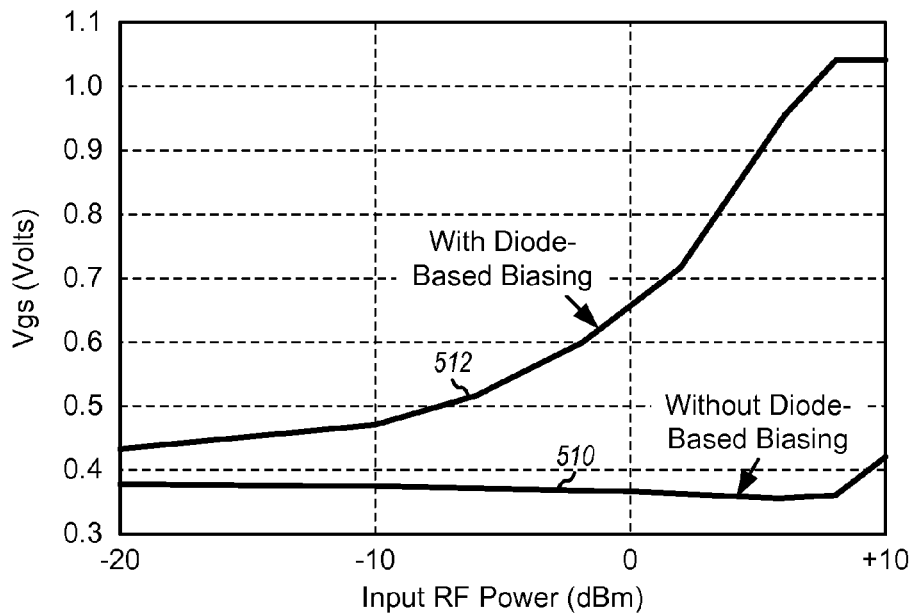
FIGS. 5A and 5B show plots of gate-to-source voltage and gain of a transistor with and without diode-based biasing.

FIG. 5A shows plots of the Vgs voltage of NMOS transistor 212 with and without diode-based biasing. The effect of diode-based biasing is stronger when applied to three NMOS transistors in FIG. 4 instead of only one NMOS transistor in FIG. 3. In FIG. 5A, the horizontal axis denotes input RF power of the RFin signal and is given in units of dBm. The vertical axis denotes the Vgs voltage of NMOS transistor 212 and is given in units of Volts (V). A plot 510 shows the Vgs voltage of NMOS transistor 212 in FIG. 2 without diode-based biasing. A plot 512 shows the Vgs voltage of NMOS transistor 212 in FIG. 4 with diode-based biasing provided by diode-connected NMOS transistor 242. As shown in FIG. 5A, the Vgs voltage of NMOS transistor 212 is relatively constant without diode-based biasing and increases with input RF power when diode-based biasing is used.

Figure 5B:
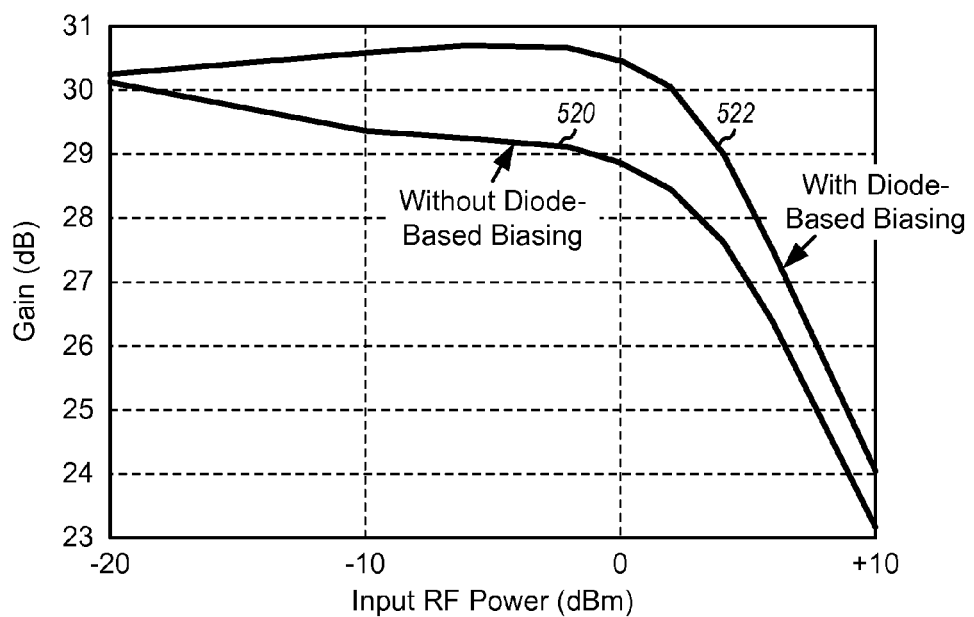

FIG. 5B shows plots of the gain of NMOS transistor 212 with and without diode-based biasing. In FIG. 5B, the horizontal axis denotes input RF power and is given in units of dBm. The vertical axis denotes the gain of NMOS transistor 212 and is given in units of decibel (dB). A plot 520 shows the gain of NMOS transistor 212 in FIG. 2 without diode-based biasing. A plot 522 shows the gain of NMOS transistor 212 in FIG. 4 with diode-based biasing provided by diode-connected NMOS transistor 242. As shown in FIG. 5B, the gain of NMOS transistor 212 drops off at high input RF power without diode-based biasing and peaks slightly at high input RF power with diode-based biasing.

Diode-connected NMOS transistor 242 can increase the Vgs voltage of NMOS transistor 212 at high input RF power, as shown in FIG. 5A. The size of NMOS transistor 242 may be smaller than the size of NMOS transistor 212 and may be selected to obtain the desired increase in the Vgs voltage of NMOS transistor 212 at high input RF power. The smaller size of NMOS transistor 242 may prevent the Vgs voltage of NMOS transistor 242 from increasing and the Vgs voltage of NMOS transistor 212 from decreasing at low input RF power. For a given amount of change in RF current, the change in the Vgs voltage of NMOS transistor 242 may be much larger than that of NMOS transistor 212. Multiple diode-connected NMOS transistors may also be coupled in series to further increase the Vgs voltage of NMOS transistor 212 at high input RF power.

The size of capacitor 262 and the size of diode-connected NMOS transistors 242 may be selected together. In general, a larger capacitor 262 may be selected for a smaller NMOS transistor 242, and vice versa.

Figure 6:
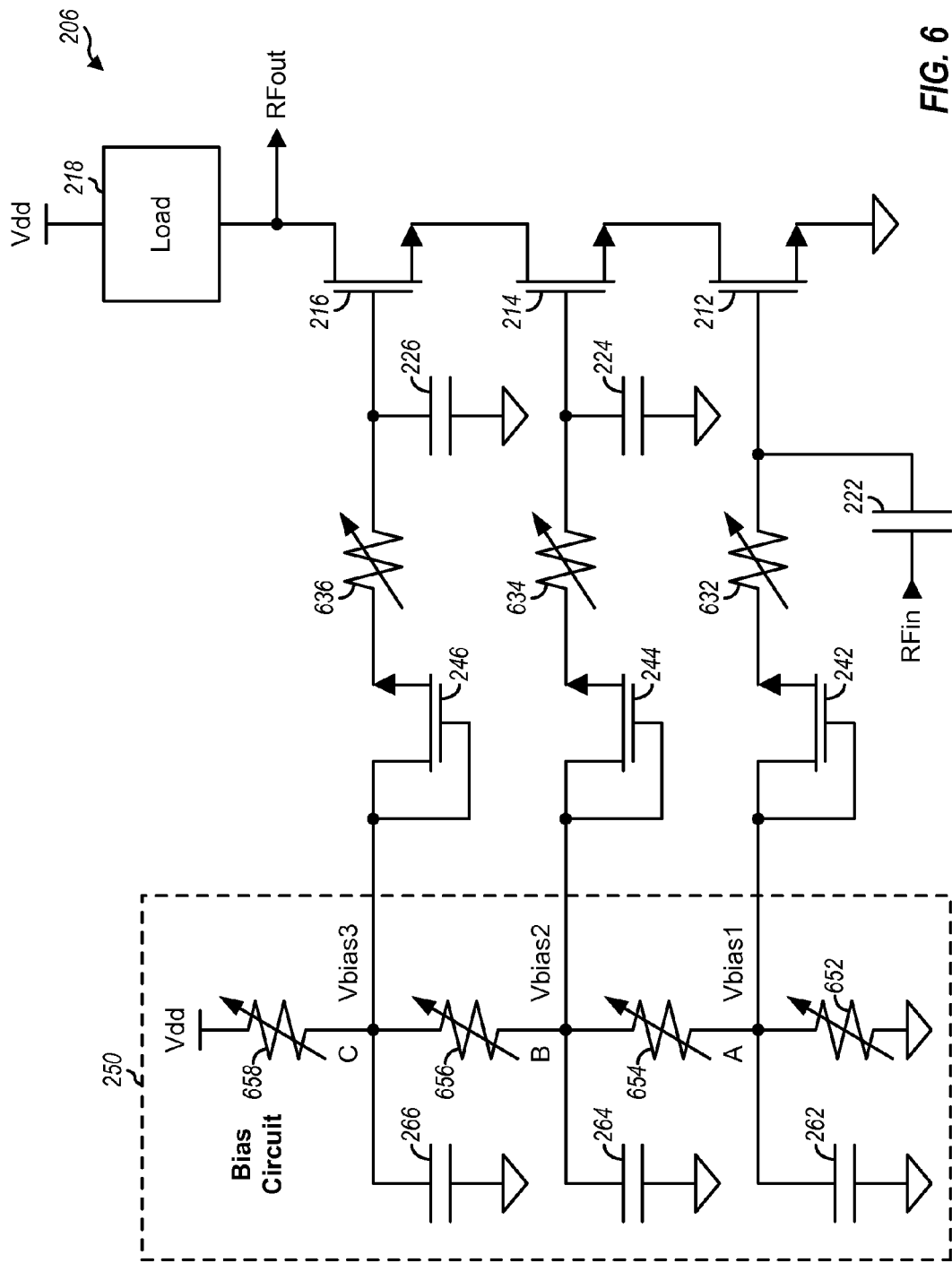
FIG. 6 shows another power amplifier with stacked transistors and diode-based biasing.

FIG. 6 shows a schematic diagram of an exemplary design of a power amplifier 206 implemented with stacked transistors and having diode-based biasing. Power amplifier 206 includes all of the circuit components in power amplifier 204 in FIG. 4, with the following differences. Power amplifier 206 includes variable resistors 632, 634 and 636 in place of fixed resistors 232, 234 and 236 in FIG. 4. Power amplifier 206 further includes variable resistors 652, 654, 656 and 658 in place of fixed resistors 252, 254, 256 and 258 in bias circuit 250 in FIG. 4.

Variable resistors 652, 654, 656 and 658 may be adjusted to obtain the desired bias voltages for NMOS transistors 212, 214 and 216, e.g., to account for variations in IC process, temperature, power supply voltage, etc. Variable resistors 632, 634 and 636 may be adjusted (e.g., individually) to vary the extent of gain improvement of each NMOS transistor due to the associated diode-connected NMOS transistor. This may improve the overall gain and linearity of power amplifier 206.

FIGS. 3, 4 and 6 show exemplary designs of power amplifiers with three NMOS transistors coupled in a stack. In general, the techniques described herein may be used for amplifiers with any number of transistors (e.g., two, three, four, or more transistors) coupled in a stack. Diode-based biasing may be used for at least one transistor in the stack. For example, diode-based biasing may be used for only the gain transistor in the stack (e.g., as shown in FIG. 3) or for each transistor in the stack (e.g., as shown in FIG. 4).

FIGS. 3, 4 and 6 show exemplary designs in which diode-connected NMOS transistors are used for diode-based biasing. In other exemplary designs, diode-connected P-channel metal oxide semiconductor (PMOS) transistors may be used for diode-based biasing. For example, in FIG. 3, diode-connected NMOS transistor 242 may be replaced with a diode-connected PMOS transistor having its source coupled to node A and its gate and drain coupled to resistor 232. In some other exemplary designs, pin diodes may be used for diode-based biasing. For example, in FIG. 3, diode-connected NMOS transistor 242 may be replaced with a pin diode having its anode coupled to node A and its cathode coupled to resistor 232. Diode-based biasing may also be implemented with other circuit components.

FIGS. 3, 4 and 6 show exemplary designs of power amplifiers implemented with NMOS transistors. In general, the techniques described herein may be used for amplifiers implemented with transistors of various types. For example, diode-based biasing may be used for amplifiers implemented with PMOS transistors, bipolar junction transistors (BJTs), heterojunction bipolar transistors (HBTs), high electron mobility transistors (HEMTs), gallium arsenide (GaAs) transistors, etc. The techniques may also be used for amplifiers fabricated with various IC process technologies such as complementary metal oxide semiconductor (CMOS), silicon-on-insulator (SOI), etc.

Amplifiers implemented with stacked transistors and having diode-based biasing (e.g., as shown in FIGS. 3, 4 and 6) may have certain advantages over other amplifiers. Diode-based biasing can provide linearization based on an analog circuit that is simple and useful. Diode-based biasing can increase the DC bias voltage and increase the RF gain at high input RF power for each transistor in the stack having a diode in its DC biasing path. Diode-based biasing may significantly improve linearity of the amplifiers, which may provide other benefits described above.

Diode-based biasing may improve linearity while reducing current consumption. An amplifier may be biased with more current to obtain higher gain and better linearity. However, the amplifier would consume more bias current all the time, even when higher gain is not needed, e.g., at low input RF power. Diode-based biasing allows the gain to be increased dynamically with high input RF power, so that more bias current is used only when needed for high input RF power.

FIG. 7 shows plots of linearity performance of a power amplifier with and without diode-based biasing. In FIG. 7, the horizontal axis denotes output power level (Pout), which is given in units of dBm. The vertical axis denotes ACPR, which is given in units of dBc/30 kHz. A plot 710 shows ACPR of the power amplifier without diode-based biasing. A plot 720 shows ACPR of the power amplifier with diode-based biasing. As shown in FIG. 7, ACPR may be improved across all output power levels by use of diode-based biasing.

A power amplifier with diode-based biasing may be advantageously used under several scenarios. First, the power amplifier may be used to improve ACPR or linearity without sacrificing efficiency. For example, at an output power level of 23 dBm in FIG. 7, ACPR may be about −50 dBc/30 kHz without diode-based biasing and about −52 dBc/30 kHz with diode-based biasing. Efficiency may be about the same for both cases since the output power level is the same. However, better ACPR may be obtained with diode-based biasing. Second, the power amplifier may be used to achieve the same ACPR or linearity with better efficiency. For example, at an ACPR level of −50 dBc/30 kHz in FIG. 7, the output power level may be about 23 dBm without diode-based biasing and about 23.5 dBm with diode-based biasing. Efficiency is typically higher for higher output power level. The power amplifier may be designed based on a tradeoff between linearity and efficiency. Once the power amplifier is designed, it may be operated to obtain the desired output power level. Linearity and efficiency of the power amplifier at this output power level may then be dependent on the design of the power amplifier.

In an exemplary design, an apparatus (e.g., a wireless device, an integrated circuit, etc.) may comprise an amplifier (e.g., a power amplifier). The amplifier may comprise a plurality of transistors (e.g., NMOS transistors 212, 214 and 216 in FIG. 3 or 4) coupled in a stack and at least one diode (e.g., diode-connected NMOS transistor 242 in FIG. 3 or diode-connected NMOS transistors 242, 244 and 246 in FIG. 4). The plurality of transistors may receive and amplify an input signal and provide an output signal. The at least one diode may be operatively (e.g., indirectly) coupled to at least one transistor in the stack. Each diode may provide a variable bias voltage (e.g., Vg1 in FIG. 3) to an associated transistor in the stack.

In an exemplary design, a single diode may be operatively coupled to a single transistor in the stack, e.g., as shown in FIG. 3. The single transistor may be a gain transistor that receives the input signal and provides signal gain for the input signal. In another exemplary design, one diode may be operatively coupled to each transistor in the stack, e.g., as shown in FIG. 4. In general, one or more diodes may be operatively coupled to all or a subset of the transistors in the stack. In any case, each diode may have a lower voltage drop across the diode at high input power and may provide a higher bias voltage to the associated transistor at high input power. The at least one transistor operatively coupled to the at least one diode may have higher gain at high input power due to the higher bias voltage from the at least one diode.

The amplifier may further comprise at least one resistor (e.g., resistors 232, 234 and 236) coupled between the at least one transistor in the stack and the at least one diode. Each resistor may be a fixed resistor (e.g., as shown in FIGS. 3 and 4) or a variable resistor (e.g., as shown in FIG. 6).

The amplifier may further comprise a plurality of resistors (e.g., resistors 252 to 258 in FIGS. 3 and 4) coupled in a ladder. The plurality of resistors may provide a plurality of bias voltages (e.g., Vbias1, Vbias2 and Vbias3) for the plurality of transistors in the stack. The at least one diode may be coupled to at least one resistor in the ladder. The plurality of resistors may comprise at least one variable resistor to provide adjustable bias voltages, e.g., to account for variations in IC process, temperature, power supply, etc. The amplifier may further comprise a plurality of capacitors (e.g., capacitors 262, 264 and 266 in FIGS. 3 and 4) coupled to the plurality of resistors in the ladder. Each capacitor may provide low impedance looking from the gate of an associated transistor in the stack.

In an exemplary design, the plurality of transistors may comprise MOS transistors, e.g., NMOS transistors as shown in FIGS. 3 and 4 or PMOS transistors. The a plurality of transistors may also be implemented with transistors of other types. In an exemplary design, the at least one diode may comprise at least one NMOS transistor, each coupled as a diode. The at least one diode may also be implemented with diodes of other types.

In an exemplary design, an integrated circuit may comprise an amplifier (e.g., a power amplifier). The amplifier may comprise a plurality of MOS transistors coupled in a stack and at least one diode-connected MOS transistor. The plurality of MOS transistors may receive and amplify an input signal and provide an output signal. The at least one diode-connected MOS transistor may be operatively coupled to at least one MOS transistor in the stack. Each diode-connected MOS transistor may provide a variable bias voltage to an associated MOS transistor in the stack. In an exemplary design, a single diode-connected MOS transistor may be operatively coupled to a single MOS transistor (e.g., the gain MOS transistor) in the stack, e.g., as shown in FIG. 3. In another exemplary design, one diode-connected MOS transistor may be operatively coupled to each MOS transistor in the stack, e.g., as shown in FIG. 4. The amplifier may further comprise at least one resistor coupled between the at least one diode-connected MOS transistor and the at least one MOS transistor in the stack.

Figure 8:
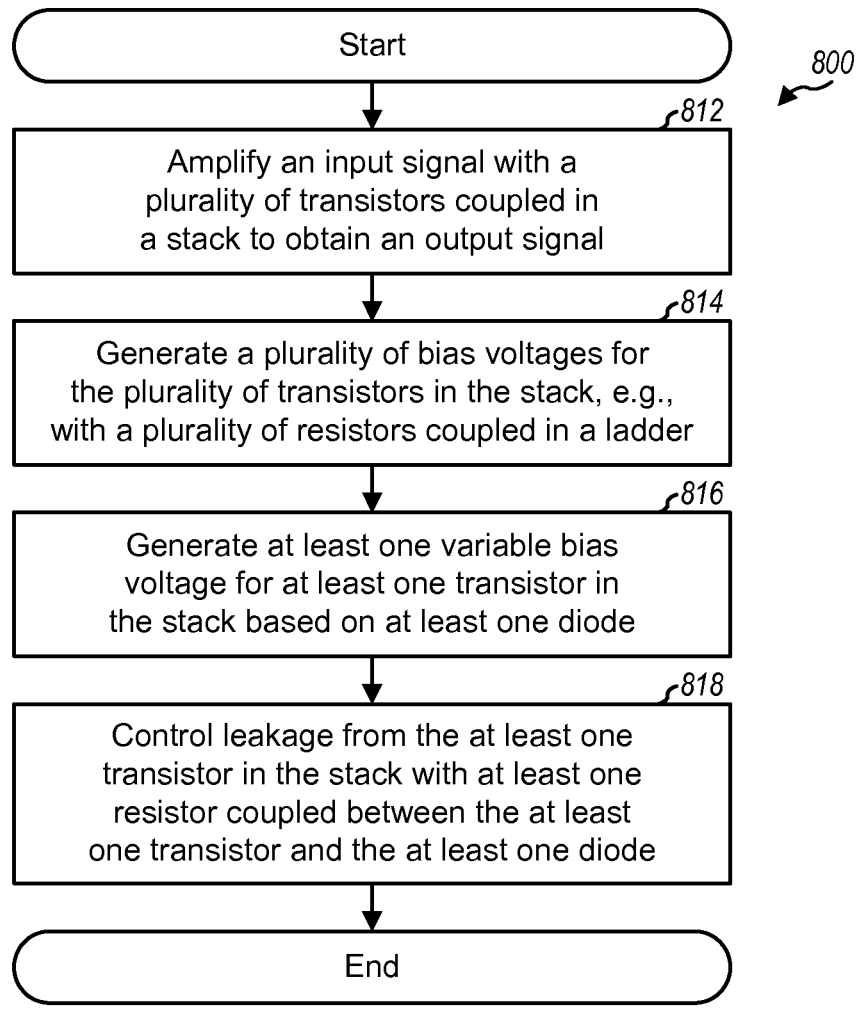
FIG. 8 shows a process for amplifying a signal.

FIG. 8 shows an exemplary design of a process 800 for amplifying a signal. An input signal may be amplified with a plurality of transistors coupled in a stack to obtain an output signal (block 812). A plurality of bias voltages for the plurality of transistors in the stack may be generated, e.g., with a plurality of resistors coupled in a ladder (block 814). At least one variable bias voltage for at least one transistor in the stack may be generated based on at least one diode (block 816). In an exemplary design, a single variable bias voltage for a single transistor in the stack may be generated based on a single diode and a fixed bias voltage from the resistor ladder. In another exemplary design, a plurality of variable bias voltages for the plurality of transistors in the stack may be generated based on a plurality of diodes, one variable bias voltage for each transistor in the stack. Leakage from the at least one transistor in the stack may be controlled (e.g., reduced) with at least one resistor coupled between the at least one transistor and the at least one diode (block 818).

The amplifiers described herein may be implemented on an IC, an analog IC, an RFIC, a mixed-signal IC, an ASIC, a printed circuit board (PCB), an electronic device, etc. The amplifiers may also be fabricated with various IC process technologies such as CMOS, NMOS, PMOS, BJT, bipolar-CMOS (BiCMOS), silicon germanium (SiGe), GaAs, etc.

An apparatus implementing the amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising: an amplifier comprising a plurality of transistors coupled in a stack and to receive and amplify an input signal and provide an output signal, and at least one diode having a variable voltage drop operatively coupled in series to a gate of at least one transistor in the stack, each diode provides a variable bias voltage to an associated transistor in the stack and each of the plurality of transistors further biased by a common bias circuit.

2. The apparatus of claim 1, the at least one diode comprises a single diode operatively coupled to a single transistor in the stack, the single transistor receives the input signal and provides signal gain for the input signal.

3. The apparatus of claim 1, the at least one diode comprises one diode for each transistor in the stack, each diode operatively coupled to an associated transistor in the stack.

4. The apparatus of claim 1, each diode has a lower voltage drop across the diode at high input power and provides a higher bias voltage to the associated transistor at high input power.

5. The apparatus of claim 4, the at least one transistor has higher gain at high input power due to higher bias voltage from the at least one diode.

6. The apparatus of claim 1, the amplifier further comprising at least one resistor coupled between the at least one transistor in the stack and the at least one diode.

7. The apparatus of claim 6, each of the at least one resistor is a variable resistor.

8. The apparatus of claim 1, the amplifier further comprising a plurality of resistors coupled in a ladder and to provide a plurality of bias voltages for the plurality of transistors in the stack, the at least one diode is coupled to at least one resistor in the ladder.

9. The apparatus of claim 8, the plurality of resistors comprise at least one variable resistor to provide at least one adjustable bias voltage among the plurality of bias voltages.

10. The apparatus of claim 8, the amplifier further comprising a plurality of capacitors coupled to the plurality of resistors in the ladder, one capacitor for each transistor in the stack, each capacitor provides low impedance looking from a gate of an associated transistor in the stack.

11. The apparatus of claim 1, the plurality of transistors comprise metal oxide semiconductor (MOS) transistors.

12. The apparatus of claim 1, the plurality of transistors comprise N-channel metal oxide semiconductor (NMOS) transistors.

13. The apparatus of claim 12, the at least one diode comprises at least one NMOS transistor each coupled as a diode.

14. The apparatus of claim 1, the amplifier comprises at least three transistors coupled in the stack.

15. The apparatus of claim 1, the amplifier is a power amplifier to receive an input radio frequency (RF) signal and provide an output RF signal.

16. An integrated circuit comprising: an amplifier comprising a plurality of metal oxide semiconductor (MOS) transistors coupled in a stack and to receive and amplify an input signal and provide an output signal, and at least one diode-connected MOS transistor having a variable voltage drop operatively coupled in series to a gate of at least one MOS transistor in the stack, each diode-connected MOS transistor provides a variable bias voltage to an associated MOS transistor in the stack and each of the plurality of MOS transistors further biased by a common bias circuit.

17. The integrated circuit of claim 16, the at least one diode-connected MOS transistor comprises a single diode-connected MOS transistor operatively coupled to a single MOS transistor in the stack, the single MOS transistor receives the input signal and provides signal gain for the input signal.

18. The integrated circuit of claim 16, the at least one diode-connected MOS transistor comprises one diode-connected MOS transistor for each MOS transistor in the stack, each diode-connected MOS transistor is operatively coupled to an associated MOS transistor in the stack.

19. The integrated circuit of claim 16, the amplifier further comprising at least one resistor coupled between the at least one diode-connected MOS transistor and the at least one MOS transistor in the stack.

20. A method of amplifying an input signal, comprising: amplifying the input signal with a plurality of transistors coupled in a stack to obtain an output signal; and generating at least one variable bias voltage for at least one transistor in the stack based on at least one diode having a variable voltage drop operatively coupled in series to a gate of the at least one transistor in the stack and each of the plurality of transistors further biased by a common bias circuit.

21. The method of claim 20, the generating at least one variable bias voltage comprises generating a single variable bias voltage for a single transistor in the stack based on a single diode, the single transistor receives the input signal and provides signal gain for the input signal.

22. The method of claim 20, the generating at least one variable bias voltage comprises generating a plurality of variable bias voltages for the plurality of transistors in the stack based on a plurality of diodes, one variable bias voltage for each transistor in the stack.

23. The method of claim 20, further comprising: controlling leakage from the at least one transistor in the stack with at least one resistor coupled between the at least one transistor and the at least one diode.

24. The method of claim 20, further comprising: generating a plurality of bias voltages for the plurality of transistors in the stack with a plurality of resistors coupled in a ladder.

25. An apparatus for amplifying an input signal, comprising: means for amplifying the input signal to obtain an output signal, the means for amplifying comprising a plurality of transistors coupled in a stack; and means for generating at least one variable bias voltage for at least one transistor in the stack, the means for generating comprising at least one diode having a variable voltage drop operatively coupled in series to a gate of the at least one transistor in the stack and each of the plurality of transistors further biased by a common bias circuit.

* * * * *